(12) United States Patent
Choi et al.

(10) Patent No.: US 9,160,283 B2
(45) Date of Patent: Oct. 13, 2015

(54) INTEGRATED PULSE SHAPING BIASING CIRCUITRY

(71) Applicant: RF Micro Devices, Inc., Greensboro, NC (US)

(72) Inventors: Jinsung Choi, Greensboro, NC (US); Marcelo Jorge Franco, Summerfield, NC (US)

(73) Assignee: RF Micro Devices, Inc., Greensboro, NC (US)

( * ) Notice: Subject to any disclaimer, the term of this patent is extended or adjusted under 35 U.S.C. 154(b) by 52 days.

(21) Appl. No.: 14/049,433

(22) Filed: Oct. 9, 2013

(65) Prior Publication Data

US 2014/0306766 A1 Oct. 16, 2014

Related U.S. Application Data

(60) Provisional application No. 61/811,241, filed on Apr. 12, 2013.

(51) Int. Cl.
*H01Q 11/12* (2006.01)
*H03F 3/19* (2006.01)
*H03F 1/02* (2006.01)
*H04B 1/034* (2006.01)

(52) U.S. Cl.
CPC ............... *H03F 3/19* (2013.01); *H03F 1/0261* (2013.01)

(58) Field of Classification Search
CPC .................................................. H03F 1/0211
USPC ........................................ 455/127.1; 330/296
See application file for complete search history.

(56) References Cited

U.S. PATENT DOCUMENTS 5,315,310 A * 5/1994 Eagle et al. ..................... 345/14

OTHER PUBLICATIONS

Huang, Chun-Wen Paul et al., "A Highly Integrated Dual-band SiGe Power Amplifier that Enables 256 QAM 802.11 ac WLAN Radio Front-End Designs," 2012 IEEE Radio Frequency Integrated Circuits Symposium, 2012, pp. 225-228.
Yoon, Sang-Woong, "Static and Dynamic Error Vector Magnitude Behavior of 2.4-GHz Power Amplifier," IEEE Transactions on Microwave Theory and Techniques, vol. 55, No. 4, Apr. 2007, pp. 643-647.

* cited by examiner

*Primary Examiner* — Lee Nguyen
(74) *Attorney, Agent, or Firm* — Withrow & Terranova, P.L.L.C.

(57) ABSTRACT

Integrated pulse shaping biasing circuitry for a radio frequency (RF) power amplifier includes a square wave signal generator and an inverted ramp signal generator. The square wave signal generator and the inverted ramp signal generator are coupled in parallel between an input node and current summation circuitry. The square wave signal generator generates a square wave signal. The inverted ramp signal generator generates an inverted ramp signal. The current summation circuitry receives the generated square wave signal and the inverted ramp signal, and combines the signals to generate a pulse shaped biasing signal for an RF power amplifier. The square wave signal generator, the inverted ramp signal generator, and the current summation circuitry are monolithically integrated on a single semiconductor die.

22 Claims, 11 Drawing Sheets

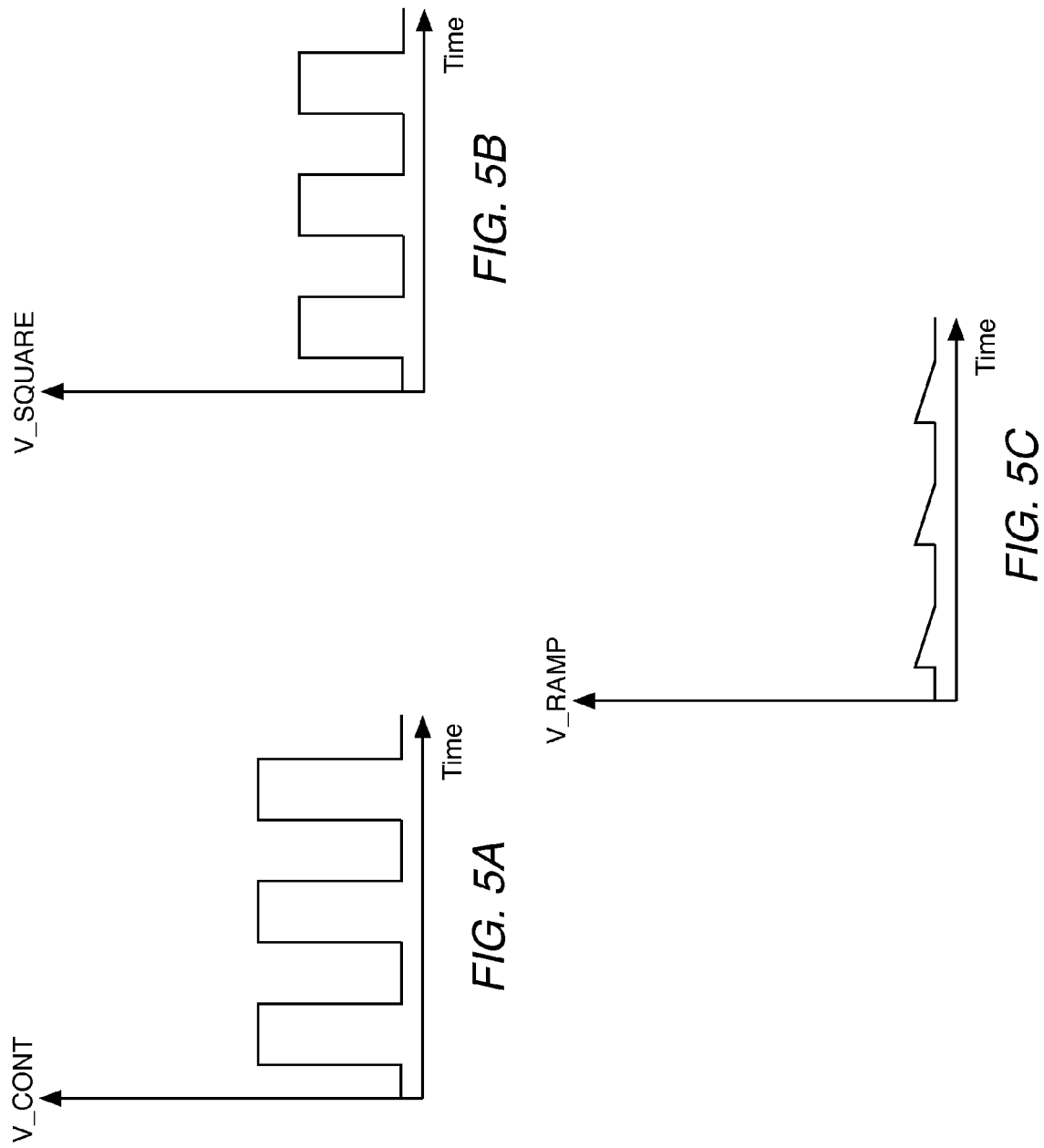

INTEGRATED PULSE SHAPING BIASING CIRCUITRY

RELATED APPLICATIONS

This application claims the benefit of U.S. provisional patent application Ser. No. 61/811,241, filed Apr. 12, 2013, the disclosure of which is incorporated herein by reference in its entirety.

FIELD OF THE DISCLOSURE

The present disclosure relates to biasing circuitry for a radio frequency power amplifier. Specifically, the present disclosure relates to integrated biasing circuitry for maintaining a constant gain of a radio frequency power amplifier in a pulsed mode of operation.

BACKGROUND

Efficiency and battery life have become primary concerns of many mobile device manufacturers. Often, a large portion of the power consumed in a mobile device is due to the radio frequency (RF) power amplifiers used to transmit and receive signals from the device. Accordingly, by reducing the power consumption of the RF power amplifiers of a mobile device, the efficiency and battery life of a mobile device can be substantially improved.

One way to reduce the power consumption of an RF power amplifier is to operate the RF power amplifier in a pulsed mode of operation. In a pulsed mode of operation, an RF power amplifier is powered on and driven to a certain output level in order to amplify an RF signal, then shut down and placed in a state of low power consumption. Although effective for reducing the total amount of power consumed by the RF power amplifier, operating an RF power amplifier in a pulsed state of operation results in a non-linear gain function of the RF power amplifier with respect to the power-on time of the device. Specifically, as the RF power amplifier is powered on, the gain response of the RF power amplifier varies as the temperature of the internal components stabilizes. Due to the stringent wireless communications standards used by many mobile devices, the gain of the RF power amplifier generally does not have time to stabilize after it is powered on before amplification of a signal is required by the mobile device. The resulting gain variation of the RF power amplifier produces non-linear distortion that causes an increase in the error vector magnitude of the signal being amplified. An increased error vector magnitude of an amplified signal may negatively impact the performance and reliability of a mobile device in which the RF power amplifier is integrated.

FIG. 1 shows a graph 10 representing the gain of an RF power amplifier operated in a pulsed mode of operation with respect to the power-on time of the device. As shown by a trend line 12, the gain of the RF power amplifier is non-linear with respect to the power-on time of the device. Specifically, the gain of the device increases in a logarithmic fashion during a "warm up" period 14 of the RF power amplifier, as the internal components of the RF power amplifier stabilize. Accordingly, gain variation may be experienced by a signal amplified by the RF power amplifier.

In order to reduce the error vector magnitude of a signal amplified by an RF power amplifier operating in a pulsed mode of operation, a pulse shaping biasing signal may be applied to the RF power amplifier. FIG. 2 shows conventional pulse shaping biasing circuitry 16 for compensating an RF power amplifier operating in a pulsed mode of operation. For context, supplemental biasing circuitry 18 and an RF power amplifier 20 are also shown. The conventional pulse shaping biasing circuitry 16 includes an input node 22, an output node 24, a resistor-capacitor (RC) ramp signal generator 26 coupled between the input node 22 and the output node 24, and a biasing resistor 28 coupled in parallel with the RC ramp signal generator 26 between the input node 22 and the output node 24. The output node 24 of the conventional pulse shaping biasing circuitry 16 is coupled to the RF power amplifier 20 through the supplemental biasing circuitry 18.

In operation, the conventional pulse shaping biasing circuitry 16 receives a control signal V_CONT at the input node 22. The control signal V_CONT may be a square wave voltage, as shown in FIG. 3A. The control signal V_CONT is delivered to the RC ramp signal generator 26 and the biasing resistor 28. The RC ramp signal generator 26 includes a ramp resistor 30 and a ramp capacitor 32. As will be appreciated by those of ordinary skill in the art, as the control signal V_CONT is passed through the RC ramp signal generator 26, an inverted ramp signal V_RAMP is generated, as shown in FIG. 3B. As the control signal V_CONT is passed through the biasing resistor 28, the amplitude of the control signal V_CONT is adjusted to produce a square wave signal V_SQUARE, as shown in FIG. 3C. The inverted ramp signal V_RAMP and the square wave signal V_SQUARE are then combined to produce a pulse shaped biasing signal V_BIAS, as shown in FIG. 3D, and delivered to the output node 24. The resulting pulse shaped biasing signal V_BIAS can be used to compensate the RF power amplifier 20 for gain variations experienced as a result of operating in a pulsed mode of operation.

The pulse shaped biasing signal V_BIAS is delivered from the conventional pulse shaping biasing circuitry 16 to the supplemental biasing circuitry 18, where the signal is amplified and subsequently delivered to the RF power amplifier 20. The RF power amplifier 20 includes an RF input terminal 34, an RF output terminal 36, and an amplifying transistor device 38. The amplifying transistor device 38 includes a collector contact C coupled to a supply voltage V_SUPP, a base contact B coupled to the supplemental biasing circuitry 18, and an emitter contact E coupled to ground. The RF input terminal 34 is coupled to the base contact B of the amplifying transistor device 38. The RF output terminal 36 is coupled to the collector contact C of the amplifying transistor device 38. The pulse shaped biasing signal V_BIAS linearizes the gain response of the RF power amplifier 20 while operating in a pulsed mode of operation by delivering a pulse function that is opposite to the gain variation experienced by the RF power amplifier after being powered on. Specifically, the initial increase in amplitude of the pulse shaped biasing signal V_BIAS compensates for the initially low gain response of the RF power amplifier 20 as it is powered on. As the gain response of the RF power amplifier 20 increases, the amplitude of the pulse shaped biasing signal V_BIAS decreases in order to maintain the gain of the device at a constant value.

Although effective at linearizing the gain response and thus reducing the error vector magnitude of signals amplified by the RF power amplifier 20, the conventional pulse shaping biasing circuitry 16 requires relatively large component values to accomplish this task. Notably, the ramp resistor 30 of the conventional pulse shaping biasing circuitry 16 generally must be on the order of 2 kΩ and the ramp capacitor 32 generally must be on the order of 100 nF in order to achieve the appropriate inverted ramp signal V_RAMP while maintaining the square wave signal V_SQUARE at a level appropriate for biasing the RF power amplifier 20. The large component values required by the conventional pulse shaping biasing circuitry 16 may consume an unnecessary amount of power and occupy a large area in the circuitry in which they are integrated. Further, the required components are practically incapable of integration due to their size, thereby leading to inefficiencies in the connection and layout of the conventional pulse shaping biasing circuitry 16.

Accordingly, there is a need for biasing circuitry that is capable of stabilizing the gain response of an RF power amplifier operated in a pulsed mode of operation while offering improved efficiency for a mobile terminal in which it is incorporated.

SUMMARY

Integrated pulse shaping biasing circuitry for a radio frequency (RF) power amplifier includes a square wave signal generator and an inverted ramp signal generator. The square wave signal generator and the inverted ramp signal generator are coupled in parallel between an input node and current summation circuitry. The square wave signal generator generates a square wave signal. The inverted ramp signal generator generates an inverted ramp signal. The current summation circuitry receives the generated square wave signal and the inverted ramp signal, and combines the signals to generate a pulse shaped biasing signal for an RF power amplifier. The square wave signal generator, the inverted ramp signal generator, and the current summation circuitry are monolithically integrated on a single semiconductor die.

The biasing circuitry allows the RF power amplifier to which it is attached to maintain a substantially constant gain while operating in a pulsed mode of operation. By monolithically integrating the square wave signal generator, the inverted ramp signal generator, and the current summation circuitry, the biasing circuitry may consume less power and provide a smaller footprint, thereby improving the performance of a mobile device in which the integrated pulse shaping biasing circuitry is integrated.

According to one embodiment, the inverted ramp signal generator includes a pair of anti-phase charging and discharging switches to charge and discharge a ramp capacitor through a current source in order to produce a ramp signal. An inverting amplifier coupled to the ramp capacitor inverts the ramp signal to produce the inverted ramp signal.

According to one embodiment, the ramp capacitor is less than ten pico-Farads.

According to one embodiment, the integrated pulse shaping biasing circuitry further includes an adjustable current amplifier between the inverted ramp signal generator and the current summation circuitry. The adjustable current amplifier adjusts the slope of the inverted ramp signal in order to modify one or more operating parameters of the RF power amplifier.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

FIGS. 5A-5E show various signals in the integrated pulse shaping biasing circuitry according to one embodiment of the present disclosure.

DETAILED DESCRIPTION

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Figure 1:
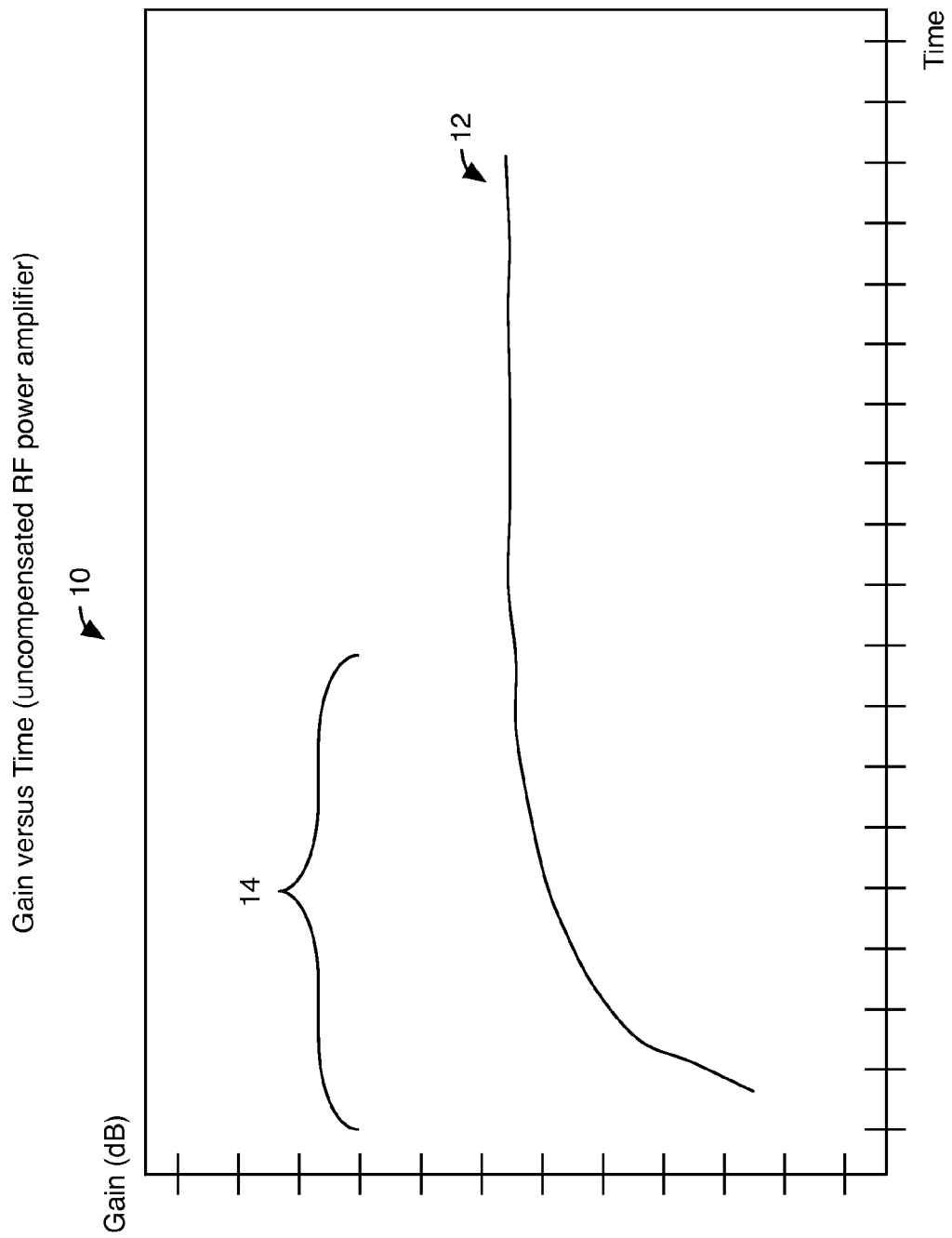
FIG. 1 is a graph representing the gain of an uncompensated RF power amplifier operated in a pulsed mode of operation with respect to the power on time of the device.
Figure 2:
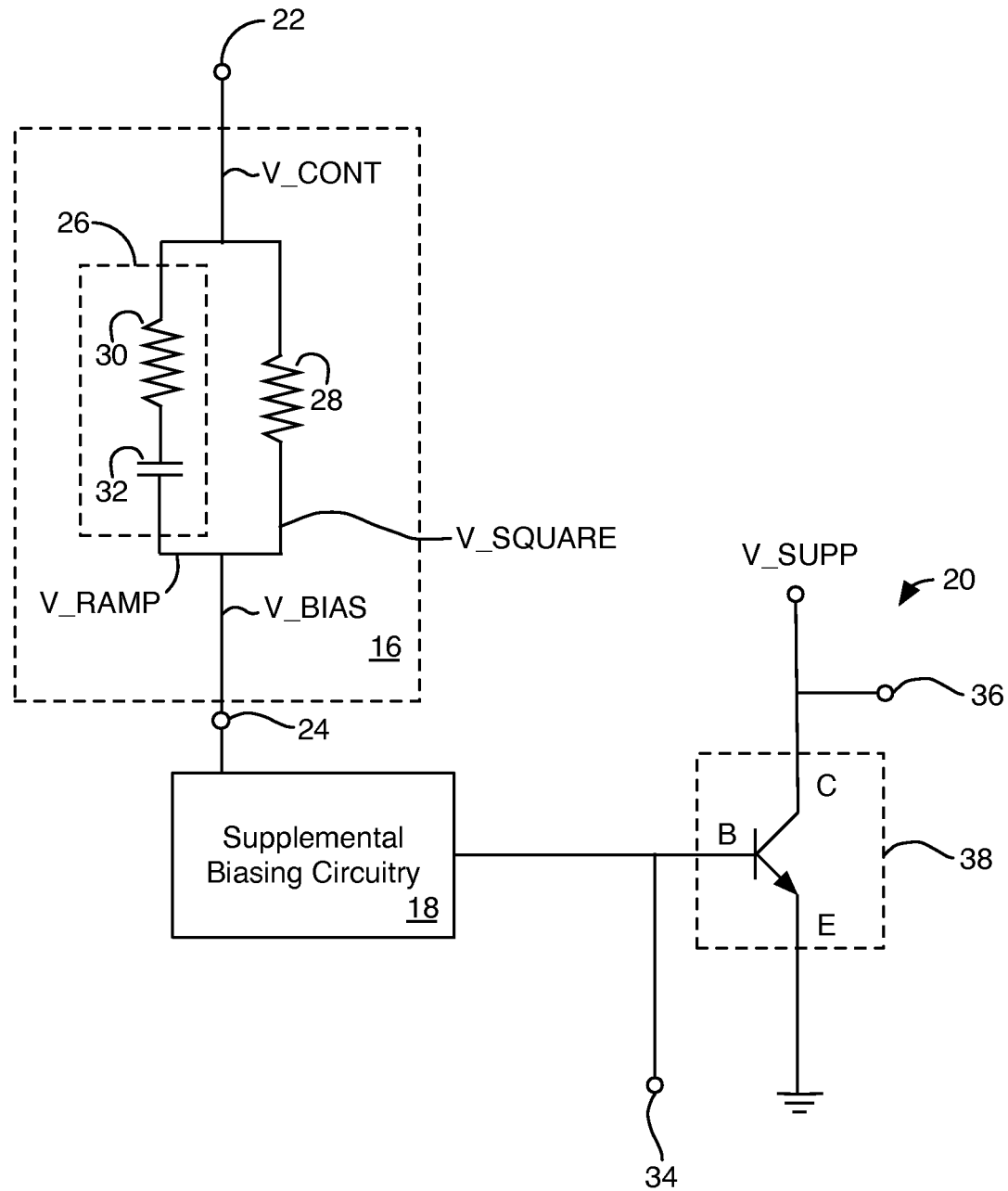
FIG. 2 is a schematic representation of conventional pulse shaping biasing circuitry.
Figure 3:
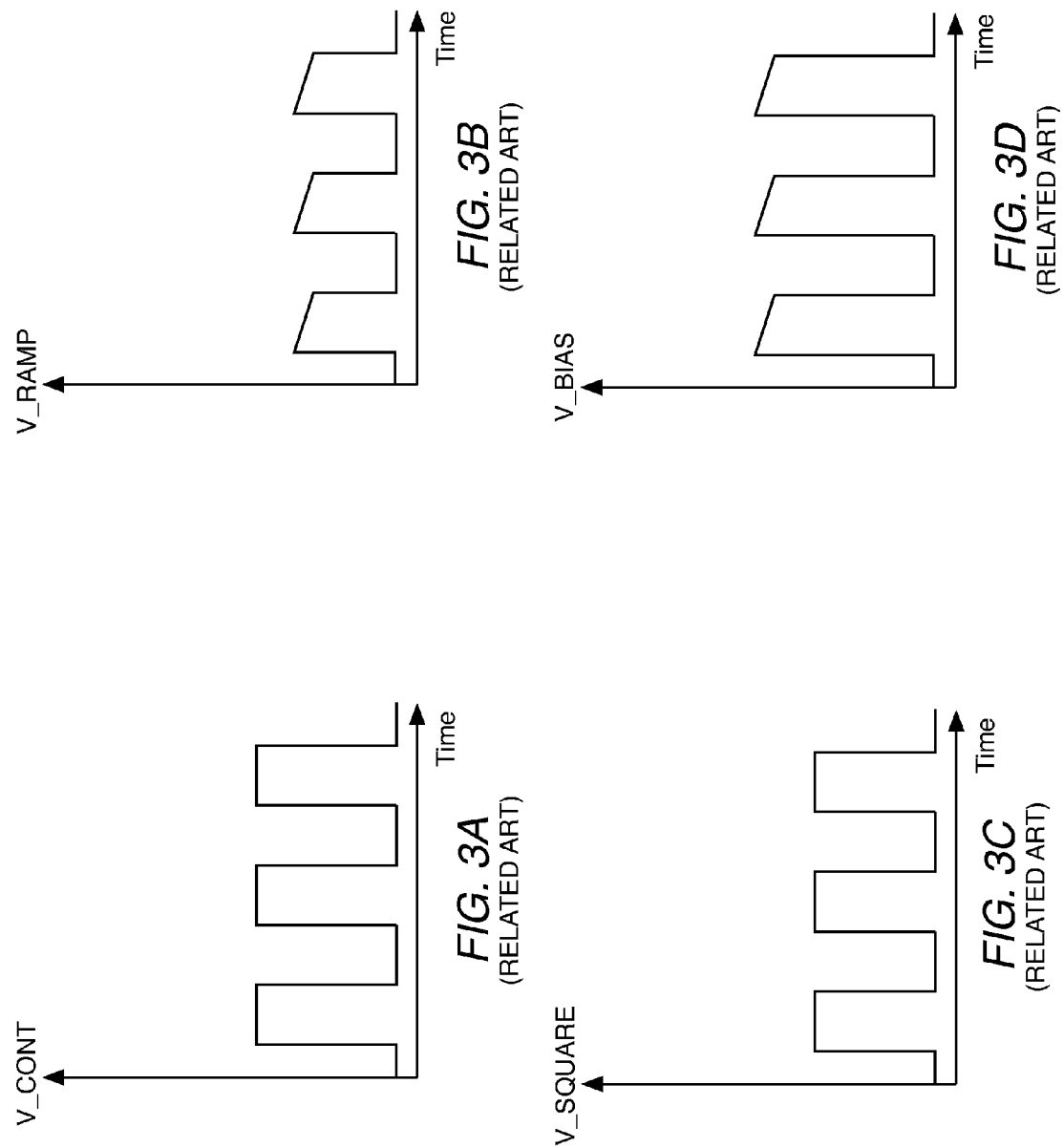
FIGS. 3A-3D show graphical representations of various signals in the conventional pulse shaping biasing circuitry.
Figure 4:
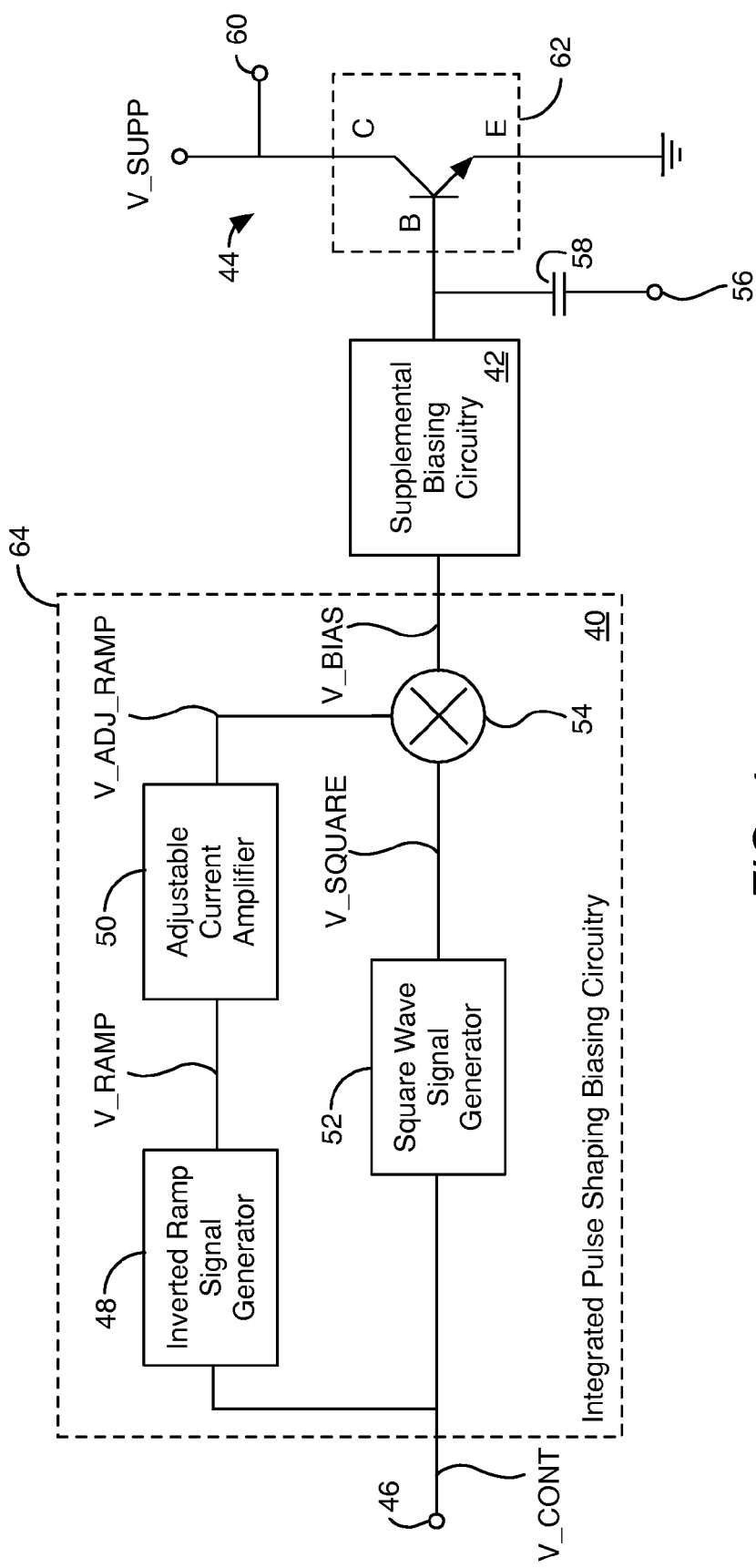
FIG. 4 shows integrated pulse shaping biasing circuitry according to one embodiment of the present disclosure.

Turning now to FIG. 4, integrated pulse shaping biasing circuitry 40 is shown according to one embodiment of the present disclosure. For context, supplemental biasing circuitry 42 and an RF power amplifier 44 are also shown. The integrated pulse shaping biasing circuitry 40 includes an input node 46, an inverted ramp signal generator 48, an adjustable current amplifier 50, a square wave signal generator 52, and current summation circuitry 54. The inverted ramp signal generator 48 and the adjustable current amplifier 50 are coupled in series between the input node 46 and the current summation circuitry 54. The square wave signal generator 52 is coupled in parallel with the inverted ramp signal generator 48 and the adjustable current amplifier 50 between the input node 46 and the current summation circuitry 54. The integrated pulse shaping biasing circuitry 40 may be coupled to the RF power amplifier 44 through the supplemental biasing circuitry 42.

Figure 5E:
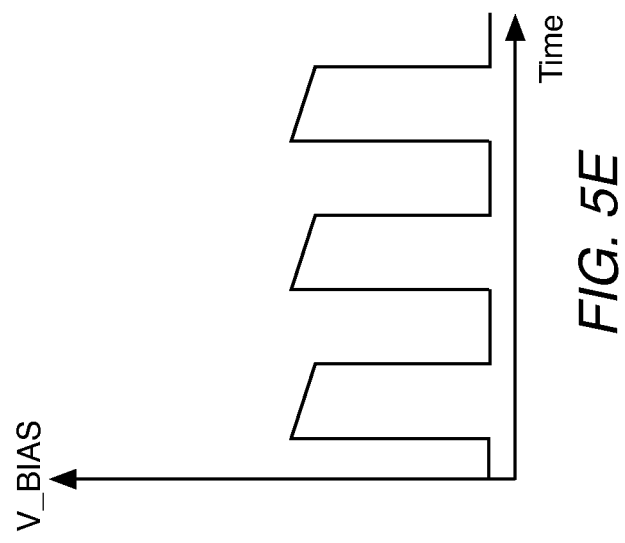
Figure 5D:
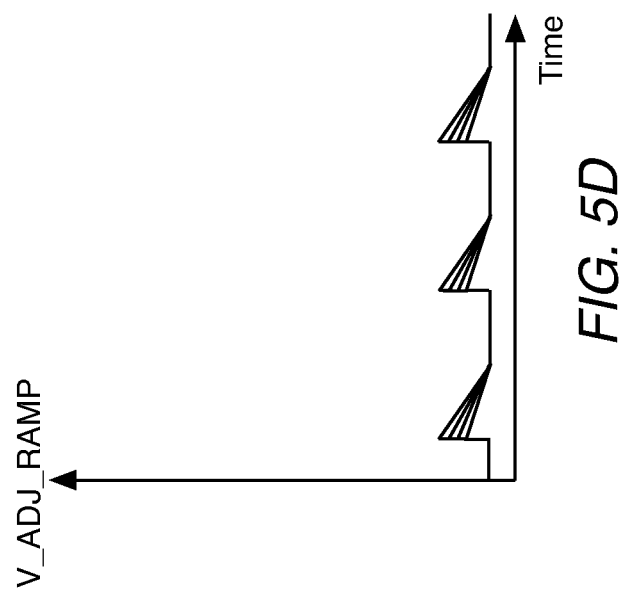

In operation, the integrated pulse shaping biasing circuitry 40 receives a control signal V_CONT, which may be a square wave signal as shown in FIG. 5A. The control signal V_CONT is delivered to the inverted ramp signal generator 48 and the square wave signal generator 52. The square wave signal generator 52 uses the control signal V_CONT to produce a square wave signal V_SQUARE, as shown in FIG. 5B, which is delivered to the current summation circuitry 54. The inverted ramp signal generator 48 uses the control signal V_CONT to produce an inverted ramp signal V_RAMP, as shown in FIG. 5C, which is then delivered to the adjustable current amplifier 50. As shown in FIG. 5C, the inverted ramp signal V_RAMP includes a step in signal amplitude, followed by a linear or non-linear decline. The adjustable current amplifier 50 adjusts the slope of the inverted ramp signal V_RAMP to produce an adjusted ramp signal V_ADJ_RAMP, as shown in FIG. 5D, and delivers the adjusted ramp signal V_ADJ_RAMP to the current summation circuitry 54. The square wave signal V_SQUARE and the adjusted ramp signal V_ADJ_RAMP are then combined by the current summation circuitry 54 to produce a pulse shaped biasing signal V_BIAS, as shown in FIG. 5E.

The pulse shaped biasing signal V_BIAS is delivered from the integrated pulse shaping biasing circuitry 40 to the supplemental biasing circuitry 42, where it may be further amplified and delivered to the RF power amplifier 44, as discussed in further detail below. The RF power amplifier 44 may include an RF input terminal 56, an RF input capacitor 58, an RF output terminal 60, and an amplifying transistor device 62. The amplifying transistor device 62 may include a collector contact C coupled to a supply voltage V_SUPP, an emitter contact E coupled to a fixed voltage, and a base contact B coupled to the supplemental biasing circuitry 42. The RF input terminal 56 may be coupled to the base contact B of the amplifying transistor device 62 through the RF input capacitor 58. The RF output terminal 60 may be coupled to the collector contact C of the amplifying transistor device 62. When applied to the RF power amplifier 44, the pulse shaped biasing voltage V_BIAS quickly raises and stabilizes the temperature of the internal components of the RF power amplifier 44. In doing so, the pulse shaped biasing voltage V_BIAS allows for a linear gain response of the RF power amplifier 44 when the RF power amplifier 44 is operated in a pulsed state of operation.

As will be appreciated by those of ordinary skill in the art, the amplifying transistor device 62 may be a bipolar junction transistor (BJT), a field effect transistor (FET), a metal-oxide-semiconductor field-effect transistor (MOSFET), or the like.

The inverted ramp signal generator 48, the adjustable current amplifier 50, the square wave signal generator 52, and the current summation circuitry 54 are monolithically integrated on a single semiconductor die 64, as discussed in further detail below. By integrating the inverted ramp signal generator 48, the adjustable current amplifier 50, the square wave signal generator 52, and the current summation circuitry 54 on the single semiconductor die 64, the performance of the integrated pulse shaping biasing circuitry 40 may be significantly improved. Further, the footprint of the integrated pulse shaping biasing circuitry 40 is reduced, thereby saving space in a mobile terminal in which the integrated pulse shaping biasing circuitry 40 is integrated.

Although the integrated pulse shaping biasing circuitry 40 is described with respect to a mobile terminal above, those of ordinary skill in the art will appreciate that the principles of the present disclosure may be applied to any wireless device.

Figure 6:
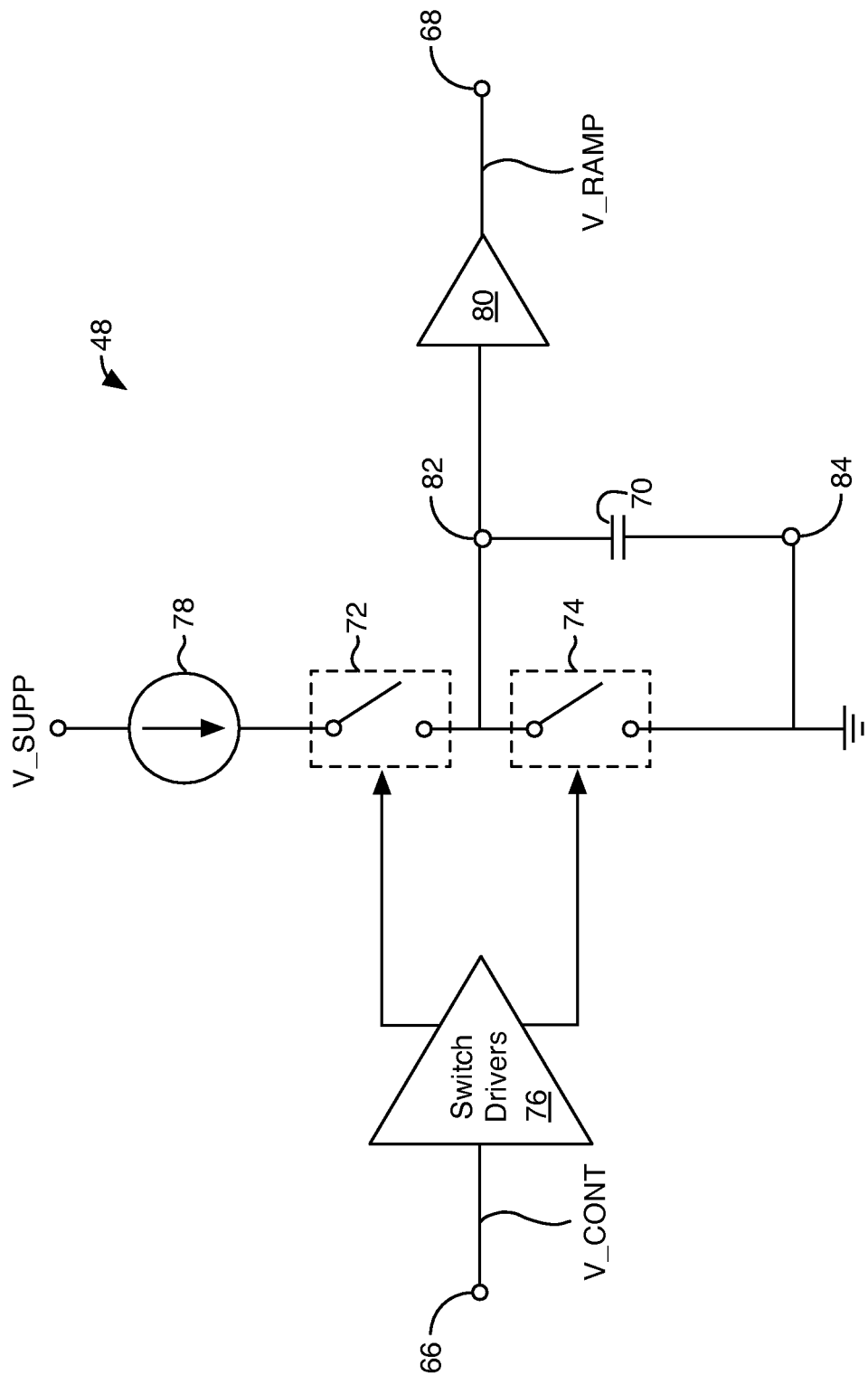
FIG. 6 is a schematic representation of the details of the inverted ramp signal generator shown in the integrated pulse shaping biasing circuitry of FIG. 4.

FIG. 6 shows details of the inverted ramp signal generator 48 according to one embodiment of the present disclosure. The inverted ramp signal generator 48 may include an input node 66, an output node 68, a ramp capacitor 70, a charging switch 72, a discharging switch 74, switch driver circuitry 76, a constant current source 78, and an inverting amplifier 80. The ramp capacitor 70 may include a first terminal 82 coupled to the constant current source 78 through the charging switch 72 and a second terminal 84 coupled to a fixed voltage. The discharging switch 74 may be coupled in parallel with the ramp capacitor 70 between the first terminal 82 and a fixed voltage. The switch driver circuitry 76 may be coupled to each one of the charging switch 72 and the discharging switch 74. The inverting amplifier 80 may be coupled between the first terminal 82 of the ramp capacitor 70 and the output node 68.

In operation, the control signal V_CONT is received by the switch driver circuitry 76. The switch driver circuitry 76 uses the control signal V_CONT to drive the charging switch 72 and the discharging switch 74 so that they are 180 degrees out of phase with one another. Specifically, when the control signal V_CONT goes high, the charging switch 72 is closed and the discharging switch 74 is opened in order to begin charging the ramp capacitor 70. When the control signal V_CONT goes low, the charging switch 72 is opened and the discharging switch 74 is closed in order to discharge the ramp capacitor 70. Accordingly, the ramp capacitor 70 is continually charged by the constant current source 78 through the charging switch 72, and then discharged by the discharging switch 74, thereby creating a ramp signal. The inverting amplifier 80 then inverts the ramp signal to produce the inverted ramp signal V_RAMP, as shown in FIG. 5C. By generating the inverted ramp signal V_RAMP in this way, the value of the ramp capacitor 70 can be kept low, typically on the order of 10 pF or less. The substantial savings in area gained by lowering the value of the ramp capacitor 70 allows the inverted ramp signal generator 48 to be integrated on the single semiconductor die 64 with the adjustable current amplifier 50, the square wave signal generator 52, and the current summation circuitry 54, thereby minimizing the footprint of the device. Further, using the inverted ramp signal generator 48 may result in reduced power consumption for the integrated pulse shaping biasing circuitry 40 as compared to the conventional solutions.

Figure 7:
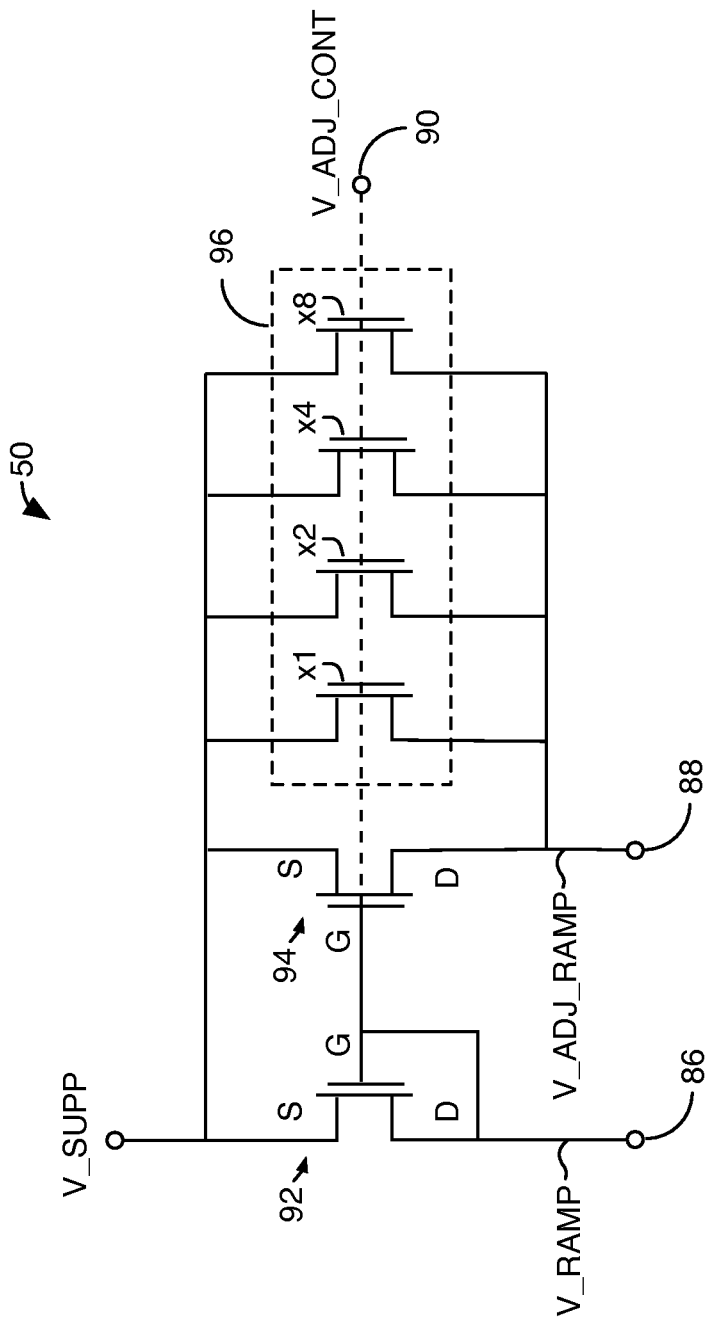
FIG. 7 is a schematic representation of the details of the adjustable current amplifier in the integrated pulse shaping biasing circuitry of FIG. 4.

FIG. 7 shows details of the adjustable current amplifier 50 shown in FIG. 4 according to one embodiment of the present disclosure. The adjustable current amplifier 50 may include an input node 86, an output node 88, a control node 90, a first amplifying transistor 92, a second amplifying transistor 94, and a plurality of multiplying transistors 96. The first amplifying transistor 92 and the second amplifying transistor 94 may be arranged in a current mirror configuration, wherein a gate contact G of the first amplifying transistor 92 is coupled to a gate contact G of the second amplifying transistor 94, a source contact S of the first amplifying transistor 92 and a source contact S of the second amplifying transistor 94 are coupled to the supply voltage V_SUPP, a drain contact D of the second amplifying transistor 94 is coupled to the output node 88, and a drain contact D of the first amplifying transistor 92 is coupled to the gate contact G of the first amplifying transistor 92, the gate contact G of the second amplifying transistor 94, and the input node 86. Each one of the plurality of multiplying transistors 96 may be coupled in parallel between the source contact S and the drain contact D of the second amplifying transistor 94. The control node 90 may be coupled to each one of the multiplying transistors 96.

The first amplifying transistor 92 and the second amplifying transistor 94 may be, for example, metal-oxide-semiconductor field-effect transistors (MOSFETs), field-effect transistors (FETs), bipolar junction transistors (BJTs), or the like. Similarly, each one of the multiplying transistors 96 may comprise a transistor device such as a MOSFET, FET, BJT, or the like.

In operation, the adjustable current amplifier 50 receives the inverted ramp signal V_RAMP at the input node 86 from the inverted ramp signal generator 48. The inverted ramp signal V_RAMP is then mirrored and amplified by the second amplifying transistor 94 to produce the adjusted ramp current signal V_ADJ_RAMP, and is subsequently delivered to the output node 88. A current adjust control signal V_ADJ_CONT determines which of the multiplying transistors 96 are saturated or conducting, thereby adjusting the gain of the current mirror formed between the first amplifying transistor 92 and the second amplifying transistor 94. Accordingly, the slope of the adjusted ramp current signal V_ADJ_RAMP may be adjusted in order to better compensate the RF power amplifier 44 to linearize the gain response of the device. For example, the slope of the adjusted ramp current signal V_ADJ_RAMP may be increased in order to compensate for a slower increase in gain of the RF power amplifier 44 as the device is powered on.

Figure 8:
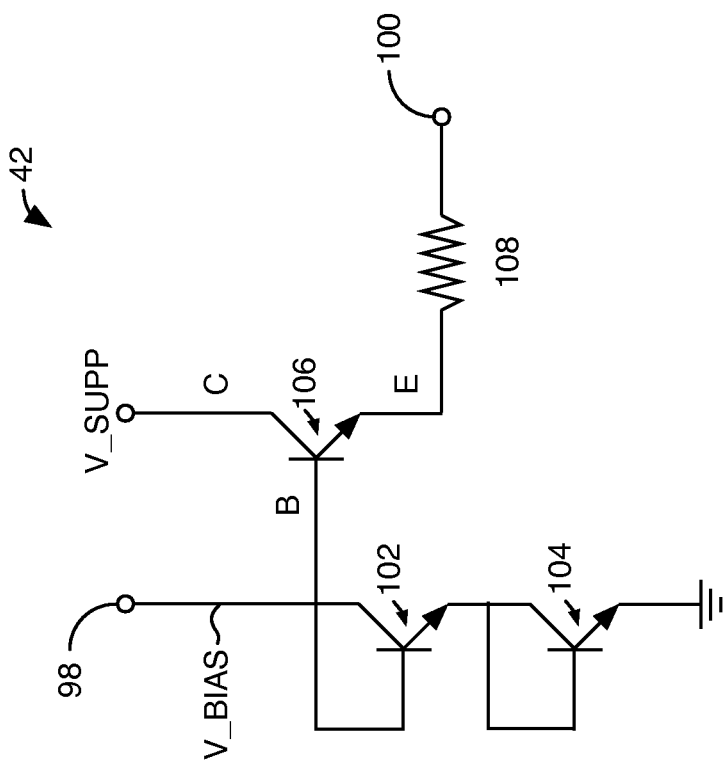
FIG. 8 is a schematic representation of the details of the supplementary biasing circuitry shown in FIG. 4.

FIG. 8 shows details of the supplemental biasing circuitry 42 shown in FIG. 4 according to one embodiment of the present disclosure. The supplemental biasing circuitry 42 may include an input node 98, an output node 100, a first diode connected transistor 102, a second diode connected transistor 104, a biasing transistor 106, and a biasing resistor 108. The first diode connected transistor 102 and the second diode connected transistor 104 may be coupled in series between the input node 98 and a fixed voltage. The biasing transistor 106 may include a base contact B coupled to the input node 98, a collector contact C coupled to the supply voltage V_SUPP, and an emitter contact E coupled to the output node 100 through the biasing resistor 108.

The first diode connected transistor 102, the second diode connected transistor 104, and the biasing transistor 106 may be BJTs, FETs, MOSFETs, or the like.

In operation, the supplemental biasing circuitry 42 receives the pulse shaped biasing signal V_BIAS at the input node 98 from the current summation circuitry 54. The pulse shaped biasing signal V_BIAS is then passed into the base contact B of the biasing transistor 106, where it is amplified and passed through the biasing resistor 108 to the RF power amplifier 44. The first diode connected transistor 102 and the second diode connected transistor 104 provide a voltage reference at the base contact B of the biasing transistor 106.

Although the supplemental biasing circuitry 42 is shown including the first diode connected transistor 102, the second diode connected transistor 104, the biasing transistor 106, and the biasing resistor 108, those of ordinary skill in the art will appreciate that the integrated pulse shaping biasing circuitry 40 may be used with any supplemental biasing circuitry 42 capable of accepting current as a reference for providing a biasing signal to the RF power amplifier 44.

Figure 9:
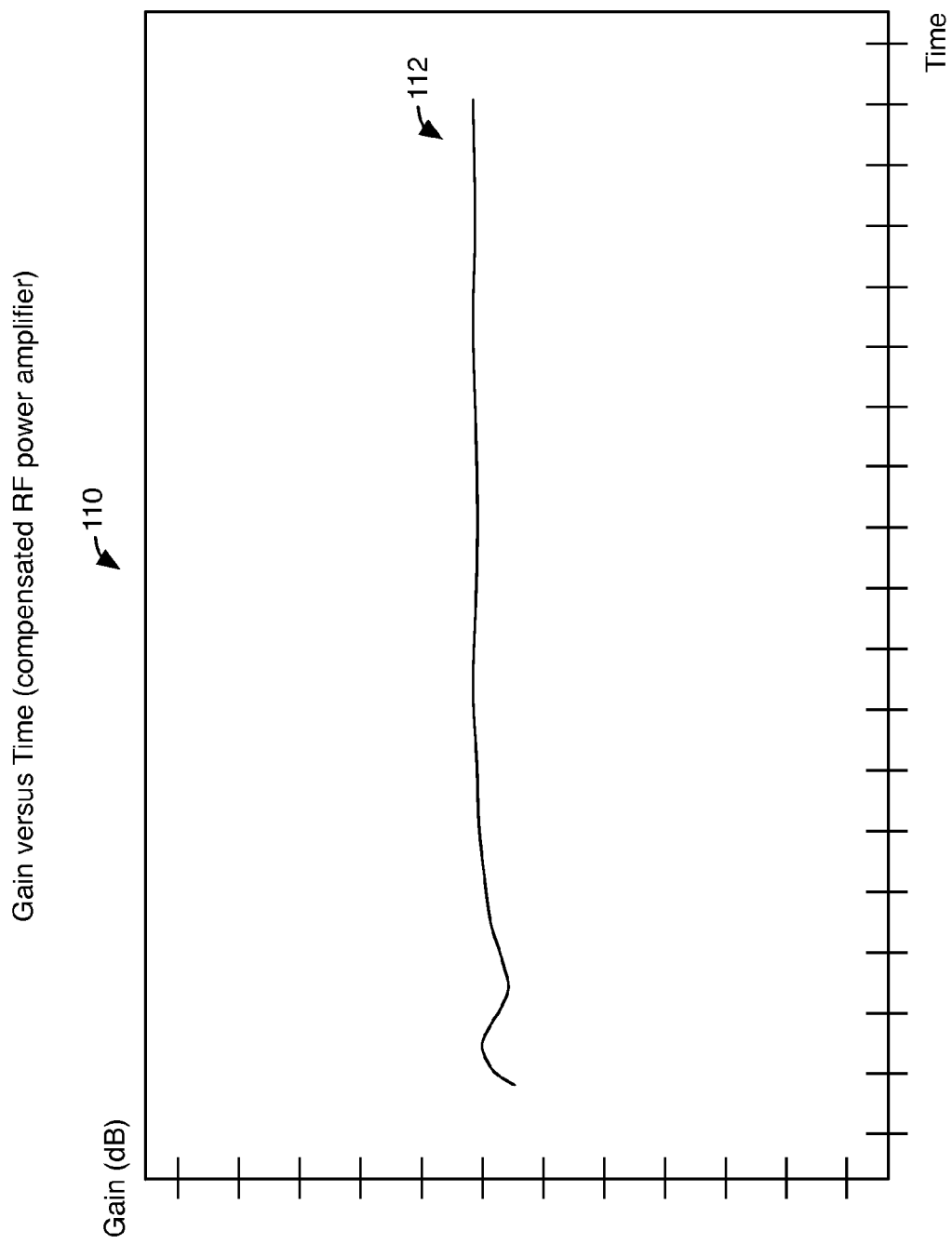
FIG. 9 is a graph representing the gain of an RF power amplifier compensated by the integrated pulse shaping biasing circuitry shown in FIG. 4 and operated in a pulsed mode of operation with respect to the power on time of the device.

FIG. 9 shows a graph 110 representing the approximate gain with respect to the turn-on time of an RF power amplifier including the integrated pulse shaping biasing circuitry 40 and operated in a pulsed mode of operation. As shown by the trend line 112, the gain of the RF power amplifier remains substantially constant over time, thereby resulting in improved performance and reliability of a mobile terminal in which the RF power amplifier and pulse shaping biasing circuitry are integrated.

Figure 10:
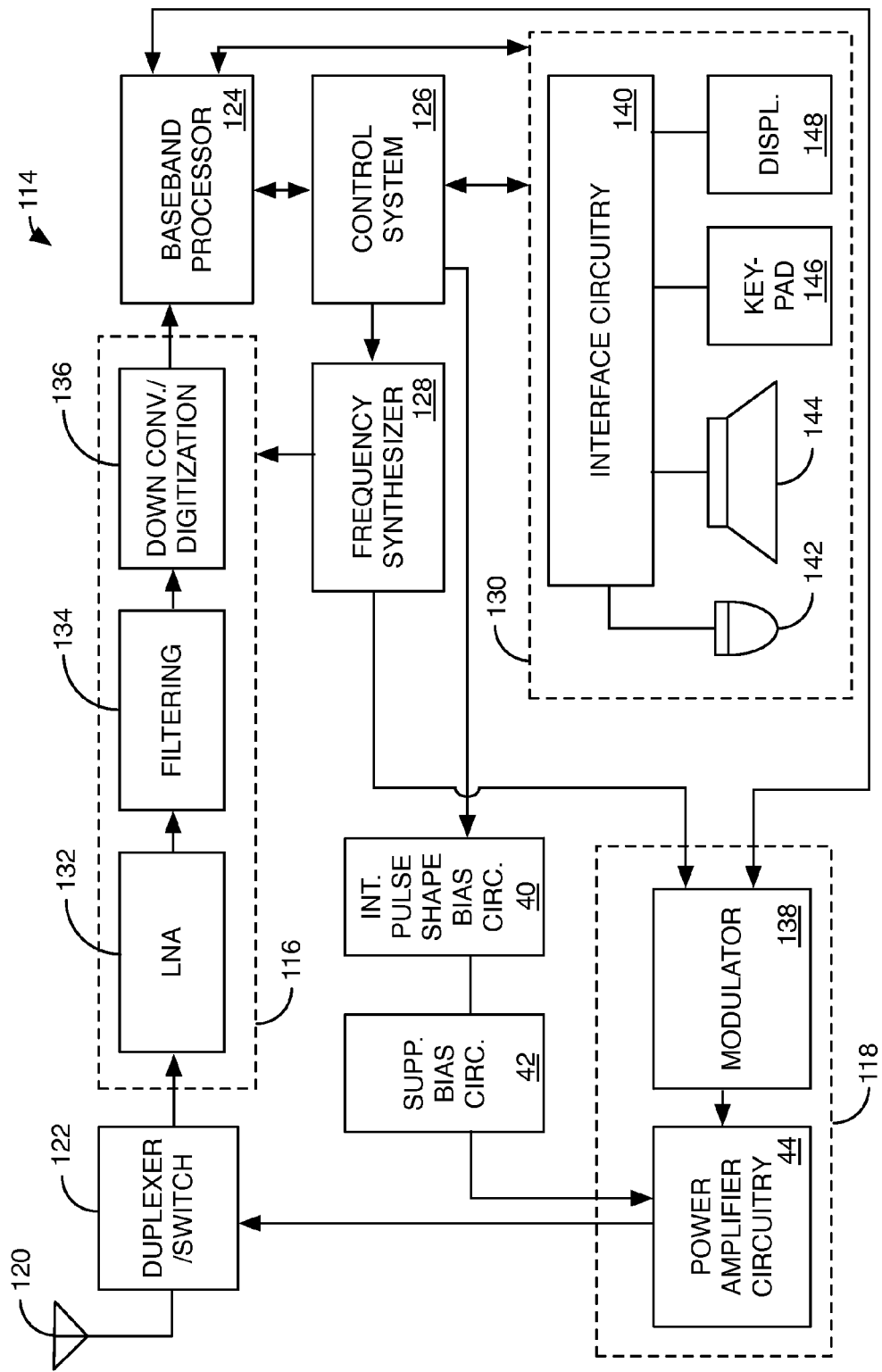
FIG. 10 is a schematic representation of a mobile terminal including the integrated pulse shaping biasing circuitry of FIG. 4 according to one embodiment of the present disclosure.

One application of the pulse shaping biasing circuitry 40 shown in FIG. 4 is in the radio frequency transmitter section of a mobile terminal 114, the basic architecture of which is represented in FIG. 10. The mobile terminal 114 may include a receiver front end 116, a radio frequency transmitter section 118, an antenna 120, a duplexer or switch 122, a baseband processor 124, a control system 126, a frequency synthesizer 128, and an interface 130. The receiver front end 116 receives information bearing radio frequency signal from one or more remote transmitters provided by a base station (not shown). A low noise amplifier (LNA) 132 amplifies the signal. Filtering circuitry 134 minimizes broadband interference in the received signal, while down conversion and digitization circuitry 136 down converts the filtered, received signal to an intermediate or baseband frequency signal, which is then digitized into one or more digital streams. The receiver front end 116 typically uses one or more mixing frequencies generated by the frequency synthesizer 128. The baseband processor 124 processes the digitized received signal to extract the information or data bits conveyed in the signal. This processing typically comprises demodulation, decoding, and error correction operations. As such, the baseband processor 124 is typically implemented in one or more digital signal processors (DSPs).

On the transmit side, the baseband processor 124 receives digitized data, which may represent voice, data, or control information, from the control system 126, which it encodes for transmission. The encoded data is output to the radio frequency transmitter section 118, where it is used by a modulator 138 to modulate a carrier signal at a desired transmit frequency. The RF power amplifier 44 amplifies the modulated carrier signal to a level appropriate for transmission, and delivers the amplified and modulated carrier signal to the antenna 120 through the duplexer or switch 122. The integrated pulse shaping biasing circuitry 40 and the supplemental biasing circuitry 42 provide a pulse shaped biasing signal to the RF power amplifier 44 in order to provide a linear gain response of the RF power amplifier 44 while in a pulsed mode of operation.

A user may interact with the mobile terminal 114 via the interface 130, which may include interface circuitry 140 associated with a microphone 142, a speaker 144, a keypad 146, and a display 148. The interface circuitry 140 typically includes analog-to-digital converters, digital-to-analog converters, amplifiers, and the like. Additionally, it may include a voice encoder/decoder, in which case it may communicate directly with the baseband processor 124. Audio information encoded in the received signal is recovered by the baseband processor 124, and converted by the interface circuitry 140 into an analog signal suitable for driving the speaker 144. The keypad 146 and the display 148 enable the user to interact with the mobile terminal 114. For example, the keypad 146 and the display 148 may enable the user to input numbers to be dialed, access address book information, or the like, as well as monitor call progress information.

Those skilled in the art will recognize improvements and modifications to the embodiments of the present disclosure. All such improvements and modifications are considered within the scope of the concepts disclosed herein and the claims that follow.

What is claimed is:

1. Integrated pulse shaping biasing circuitry comprising:
   square wave signal generator circuitry coupled between an input node and current summation circuitry and configured to generate a square wave current signal;
   inverse ramp current generator circuitry coupled in parallel with the square wave signal generator circuitry between the input node and the current summation circuitry and configured to generate an inverted ramp current signal, wherein the square wave signal generator circuitry, the inverse ramp current generator circuitry, and the current summation circuitry are monolithically integrated on a single semiconductor die; and
   adjustable current amplifier circuitry coupled in series between the inverse ramp current generator circuitry and the current summation circuitry and configured to adjust a slope of the inverted ramp current signal.

2. The integrated pulse shaping biasing circuitry of claim 1 wherein the current summation circuitry comprises a common node.

3. The integrated pulse shaping biasing circuitry of claim 1 wherein the square wave signal generator circuitry comprises a resistor.

4. The integrated pulse shaping biasing circuitry of claim 1 wherein the inverse ramp current generator circuitry comprises:
   a ramp capacitor including a first terminal and a second terminal coupled to a fixed voltage;
   a charging switch coupled between the first terminal of the ramp capacitor and a constant current source;
   a discharging switch coupled in parallel between the first terminal and the second terminal of the ramp capacitor; and
   an inverting amplifier coupled between the first terminal of the ramp capacitor and an output terminal.

5. The integrated pulse shaping biasing circuitry of claim 4 wherein the ramp capacitor is less than ten pico-Farads.

6. The integrated pulse shaping biasing circuitry of claim 4 wherein the inverse ramp current generator circuitry further comprises switch driver circuitry for driving the charging switch and the discharging switch.

7. The integrated pulse shaping biasing circuitry of claim 6 wherein the switch driver circuitry is configured to drive the charging switch and the discharging switch 180 degrees out of phase with one another.

8. The integrated pulse shaping biasing circuitry of claim 4 wherein the square wave signal generator circuitry comprises a resistor.

9. The integrated pulse shaping biasing circuitry of claim 8 further comprising adjustable current amplifier circuitry coupled in series between the inverse ramp current generator circuitry and the current summation node and configured to adjust the slope of the inverted ramp current signal.

10. The integrated pulse shaping biasing circuitry of claim 4 wherein the square wave signal generator circuitry comprises a switchable current source.

11. A radio frequency (RF) transmitter section for a mobile terminal comprising:
    a modulator configured to receive a baseband signal and modulate the baseband signal at a desired carrier frequency;
    RF power amplifier circuitry coupled to the modulator and configured to receive the baseband signal from the modulator and amplify the baseband signal for transmission from an antenna; and
    integrated pulse shaping biasing circuitry coupled to the RF power amplifier circuitry and configured to linearize a gain response of the RF power amplifier circuitry and comprising:
        current summation circuitry coupled to a biasing input of the RF power amplifier circuitry;
        square wave signal generator circuitry coupled between an input node and the current summation circuitry and configured to generate a square wave current signal;
        inverse ramp current generator circuitry coupled in parallel with the square wave signal generator circuitry between the input node and the current summation circuitry and configured to generate an inverted ramp current signal, wherein the square wave signal generator circuitry, the inverse ramp current generator circuitry, and the current summation circuitry are monolithically integrated on a single semiconductor die; and
        adjustable current amplifier circuitry coupled in series between the inverse ramp current generator circuitry and the current summation circuitry and configured to adjust a slope of the inverted ramp current signal.

12. The RF transmitter section of claim 11 further comprising supplemental biasing circuitry coupled between the current summation circuitry and the RF power amplifier circuitry and configured to amplify a pulse shaped biasing signal produced by the integrated pulse shaping biasing circuitry before delivery to the RF power amplifier circuitry.

13. The RF transmitter section of claim 11 wherein the current summation circuitry comprises a common node.

14. The RF transmitter section of claim 11 wherein the square wave signal generator circuitry comprises a resistor.

15. The RF transmitter section of claim 11 wherein the inverse ramp current generator circuitry comprises:
    a ramp capacitor including a first terminal and a second terminal coupled to a fixed voltage;
    a charging switch coupled between the first terminal of the ramp capacitor and a constant current source;
    a discharging switch coupled in parallel between the first terminal and the second terminal of the ramp capacitor; and
    an inverting amplifier coupled between the first terminal of the ramp capacitor and an output terminal.

16. The RF transmitter section of claim 15 wherein the ramp capacitor is less than ten pico-Farads.

17. The RF transmitter section of claim 15 wherein the inverse ramp current generator circuitry further comprises switch driver circuitry for driving the charging switch and the discharging switch.

18. The RF transmitter section of claim 17 wherein the switch driver circuitry is configured to drive the charging switch and the discharging switch 180 degrees out of phase with one another.

19. The RF transmitter section of claim 15 wherein the square wave signal generator circuitry comprises a resistor.

20. The RF transmitter section of claim 19 wherein the integrated pulse shaping biasing circuitry further comprises adjustable current amplifier circuitry coupled in series between the inverse ramp current generator circuitry and the current summation node and configured to adjust the slope of the inverted ramp current signal.

21. The RF transmitter section of claim 15 wherein the square wave signal generator circuitry comprises a switchable current source.

22. Integrated pulse shaping biasing circuitry comprising:
square wave signal generator circuitry coupled between an input node and current summation circuitry and configured to generate a square wave current signal; and
inverse ramp current generator circuitry coupled in parallel with the square wave signal generator circuitry between the input node and the current summation circuitry and configured to generate an inverted ramp current signal, wherein the square wave signal generator circuitry, the inverse ramp current generator circuitry, and the current summation circuitry are monolithically integrated on a single semiconductor die and further wherein the inverse ramp current generator circuitry comprises:
a ramp capacitor including a first terminal and a second terminal coupled to a fixed voltage;
a charging switch coupled between the first terminal of the ramp capacitor and a constant current source;
a discharging switch coupled in parallel between the first terminal and the second terminal of the ramp capacitor; and
an inverting amplifier coupled between the first terminal of the ramp capacitor and an output terminal.

\* \* \* \* \*